United States Patent
Chakrapani et al.

(10) Patent No.: US 9,153,457 B2
(45) Date of Patent: *Oct. 6, 2015

(54) ETCH PROCESS FOR REDUCING DIRECTED SELF ASSEMBLY PATTERN DEFECTIVITY USING DIRECT CURRENT POSITIONING

(71) Applicant: Tokyo Electron Limited, Tokyo (JP)

(72) Inventors: Vidhya Chakrapani, Guilderland, NY (US); Akiteru Ko, Shenectady, NY (US); Kaushik A. Kumar, Poughkeepsie, NY (US)

(73) Assignee: Tokyo Electron Limited, Tokyo (JP)

( * ) Notice: Subject to any disclaimer, the term of this patent is extended or adjusted under 35 U.S.C. 154(b) by 57 days.

This patent is subject to a terminal disclaimer.

(21) Appl. No.: 14/018,329

(22) Filed: Sep. 4, 2013

(65) Prior Publication Data

US 2014/0370718 A1    Dec. 18, 2014

Related U.S. Application Data

(63) Continuation-in-part of application No. 13/918,794, filed on Jun. 14, 2013.

(51) Int. Cl.
*H01L 21/30* (2006.01)
*H01L 21/311* (2006.01)
(Continued)

(52) U.S. Cl.
CPC ...... *H01L 21/31138* (2013.01); *H01L 21/0337* (2013.01); *H01L 21/67103* (2013.01); *H01L 21/67109* (2013.01); *H01L 21/67248* (2013.01)

(58) Field of Classification Search
CPC ... H01L 21/311; H01L 21/0337; H01B 13/00
USPC ................................. 438/725, 703
See application file for complete search history.

(56) References Cited

U.S. PATENT DOCUMENTS

| 5,344,742 A | 9/1994 | Sintu et al. |
| 7,579,278 B2 | 8/2009 | Flake et al. |

(Continued)

FOREIGN PATENT DOCUMENTS

WO    2013035562 A1    3/2013

OTHER PUBLICATIONS

S. Wolf and R.N. Tauber, (Silicon Processing for the VLSI Era, vol. 1—Process Technology, Lattice Press, 1986 (pp. 542-557).*

(Continued)

*Primary Examiner* — Nadine Norton
*Assistant Examiner* — Mahmoud Dahimene
(74) *Attorney, Agent, or Firm* — Wood, Herron & Evans, LLP

(57) ABSTRACT

A method for preparing a patterned directed self-assembly layer for reducing directed self-assembly pattern defectivity using direct current superpositioning is provided. A substrate having a block copolymer layer overlying a first intermediate layer, said block copolymer layer comprising a first phase-separated polymer defining a first pattern and a second phase-separated polymer defining a second pattern in said block copolymer layer is provided. A first plasma etching process using plasma formed of a first process composition to remove said second phase-separated polymer while leaving behind said first pattern of said first phase-separated polymer is performed. A second plasma etching process to transfer said first pattern into said first intermediate layer using plasma formed of a second process composition is performed. In an embodiment, said first phase-separated polymer is exposed to an electron beam preceding, during, or following said first plasma etching process, or preceding or during said second plasma etching process.

19 Claims, 12 Drawing Sheets

(51) Int. Cl.
*H01L 21/033* (2006.01)
*H01L 21/67* (2006.01)

(56) References Cited

U.S. PATENT DOCUMENTS

| | | | |
|---|---|---|---|
| 7,723,009 B2* | 5/2010 | Sandhu et al. | 430/270.1 |
| 7,888,267 B2 | 2/2011 | Ko et al. | |
| 8,236,700 B2 | 8/2012 | Cole et al. | |
| 8,945,408 B2* | 2/2015 | Chakrapani et al. | 216/41 |
| 2005/0035983 A1* | 2/2005 | Cruchon-Dupeyrat et al. | 346/140.1 |
| 2009/0045163 A1 | 2/2009 | Lambertini et al. | |
| 2009/0107953 A1 | 4/2009 | Cheng et al. | |
| 2009/0117360 A1 | 5/2009 | Clevenger et al. | |
| 2009/0179002 A1 | 7/2009 | Cheng et al. | |
| 2010/0051904 A1 | 3/2010 | Xiao et al. | |
| 2011/0165382 A1 | 7/2011 | Gogolides et al. | |
| 2012/0217220 A1 | 8/2012 | Dobisz et al. | |

OTHER PUBLICATIONS

Richard Fitzpatrick (Professor of Physics the University of Texas at Austin)(Langmuir Sheaths (6 pages) published in (http://farside.ph.utexas.edu/teaching/plasma/Plasmahtml/node41.html) dated on Oct. 25, 2013 by the waybackmachine).*

International Searching Authority, International Search Report and Written Opinion in counterpart International Application No. PCT/US14/39000, dated Jun. 27, 2014, 10 pp.

U.S. Patent and Trademark Office, Final Office Action issued in related U.S. Appl. No. 13/918,794, filed Sep. 16, 2014, 6 pp.

International Searching Authority, International Search Report and Written Opinion in related International Application No. PCT/US14/48894, dated Nov. 6, 2014, 10 pp.

* cited by examiner

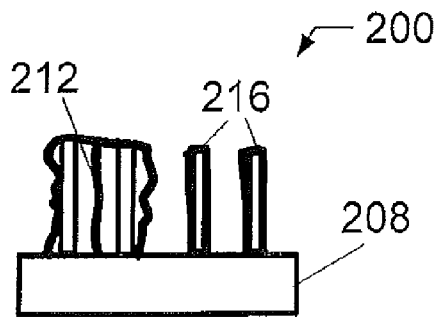
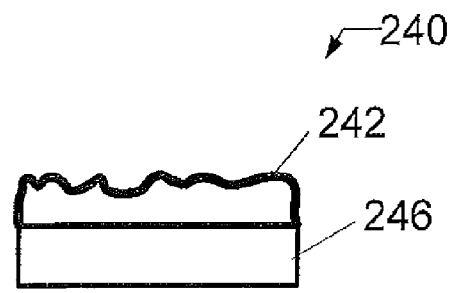
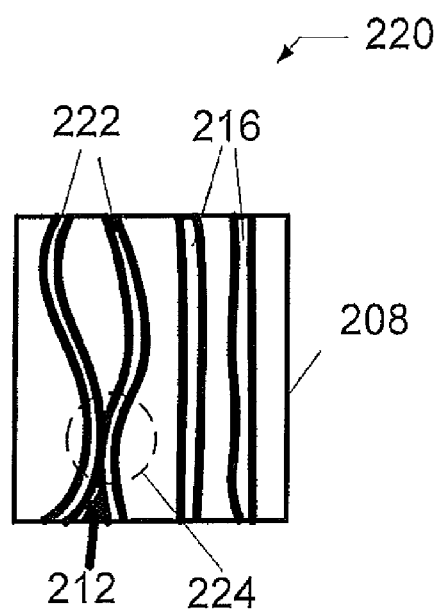
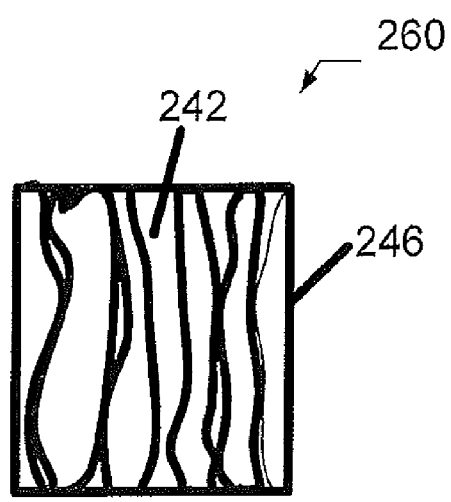
FIG. 2A Prior Art
FIG. 2B Prior Art

ETCH PROCESS FOR REDUCING DIRECTED SELF ASSEMBLY PATTERN DEFECTIVITY USING DIRECT CURRENT POSITIONING

FIELD OF THE INVENTION

This disclosure is related to methods for forming patterns in layered articles, and the layered articles formed therefrom; and more specifically, to reducing pattern collapse and other pattern defectivity in directed self-assembly applications using direct current superpositioning.

BACKGROUND OF THE INVENTION

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

Photolithography is a standard technique used to manufacture semiconductor integrated circuitry by transferring geometric shapes and patterns on a mask to the surface of a semiconductor wafer. However, current state-of-the-art photolithography tools allow minimum feature sizes down to about 25 nm. Accordingly, new methods are needed to provide smaller features.

Self-assembly of block copolymers (BCPs) has been considered a potential tool for improving the resolution to better values than those obtainable by prior art lithography methods alone. Block copolymers are compounds useful in nanofabrication because they may undergo an order-disorder transition on cooling below a certain temperature (order-disorder transition temperature TOD) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1 nm to 5 nm and may be manipulated by modification of the chemical compositions of the blocks of the copolymer.

A block copolymer may form many different phases upon self-assembly, dependent upon the volume fractions of the blocks, degree of polymerization within each block type (i.e., number of monomers of each respective type within each respective block), the optional use of a solvent and surface interactions. When applied in a thin film, the geometric confinement may pose additional boundary conditions that may limit the numbers of phases. In general, spherical (e.g., cubic), cylindrical (e.g., tetragonal or hexagonal) and lamellar phases (i.e., self-assembled phases with cubic, hexagonal or lamellar space-filling symmetry) are practically observed in thin films of self-assembled block copolymers, and the phase type observed may depend upon the relative volume fractions of the different polymer blocks. The self-assembled polymer phases may orient with symmetry axes parallel or perpendicular to the substrate and lamellar and cylindrical phases are interesting for lithography applications, as they may form line and spacer patterns and hole arrays, respectively, and may provide good contrast when one of the domain types is subsequently etched.

Two methods used to guide or direct self-assembly of a block copolymer onto a surface are graphoepitaxy and chemical pre-patterning, also called chemi-epitaxy. In the graphoepitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For instance, if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a prepattern on the substrate.

In chemi-epitaxy, the self-assembly of block copolymer domains is guided by a chemical pattern (i.e., a chemical template) on the substrate. Chemical affinity between the chemical pattern and at least one of the types of copolymer blocks within the block copolymer chain may result in the precise placement (also referred to herein as "pinning") of one of the domain types onto a corresponding region of the chemical pattern on the substrate. For instance, if the block copolymer is a di-block copolymer with A and B blocks, where A is hydrophilic and B is hydrophobic in nature, and the chemical pattern comprises of a surface having hydrophobic regions adjacent to regions that are neutral to both A and B, the B domain may preferentially assemble onto the hydrophobic region and consequently force subsequent alignment of both A and B blocks on the neutral areas. As with the graphoepitaxy method of alignment, the resolution may be improved over the resolution of the patterned substrate by the block copolymer pattern subdividing the spacing of pre-patterned features on the substrate (so-called density or frequency multiplication). However, chemi-epitaxy is not limited to a linear pre-pattern; for instance, the pre-pattern may be in the form of a 2-D array of dots suitable as a pattern for use with a cylindrical phase-forming block copolymer. Graphoepitaxy and chemi-epitaxy may be used, for instance, to guide the self-organization of lamellar or cylindrical phases, where the different domain types are arranged side-by-side on a surface of a substrate.

Accordingly, to utilize the advantages provided by graphoepitaxy and chemi-epitaxy of block copolymers, new lithographic patterning and directed self-assembly techniques are utilized. However, when removing a polystyrene-b-poly(methyl methacrylate) (PMMA) from a phase-separated layer PMMA to leave behind a polystyrene (PS) pattern, conventional etching techniques have produced pattern defectivity, such as line edge roughness/line width roughness (LER/LWR), that are unacceptable. In extreme cases, the defectivity of the PS can be catastrophic due to pattern collapse as will be discussed in more detail below. There is a need for controlled etching techniques and processes that produce acceptable results.

SUMMARY OF THE INVENTION

A method for preparing a patterned directed self-assembly layer for reducing directed self-assembly pattern defectivity using direct current superpositioning is provided. A substrate having a block copolymer layer overlying an intermediate layer, said block copolymer layer comprising a first phase-separated polymer defining a first pattern and a second phase-separated polymer defining a second pattern in said block copolymer layer is provided. A first plasma etching process using plasma formed of a first process composition to remove said second phase-separated polymer while leaving behind said first pattern of said first phase-separated polymer is performed and a second plasma etching process to transfer said first pattern at least partially into said intermediate layer using plasma formed of a second process composition containing a halogen-containing gas is performed. In an embodiment, the first phase-separated polymer is exposed to an electron beam. The exposing of the first phase-separated polymer to an electron beam is performed preceding, during, or following the first plasma etching process, or preceding or during the second etching process.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention:

FIGS. 2A and 2B are simplified schematic representations of the result of a conventional prior art method of an etching process for the patterned copolymer layer resulting in structures with defectivities;

DETAILED DESCRIPTION OF EMBODIMENTS OF THE INVENTION

Figure 1:
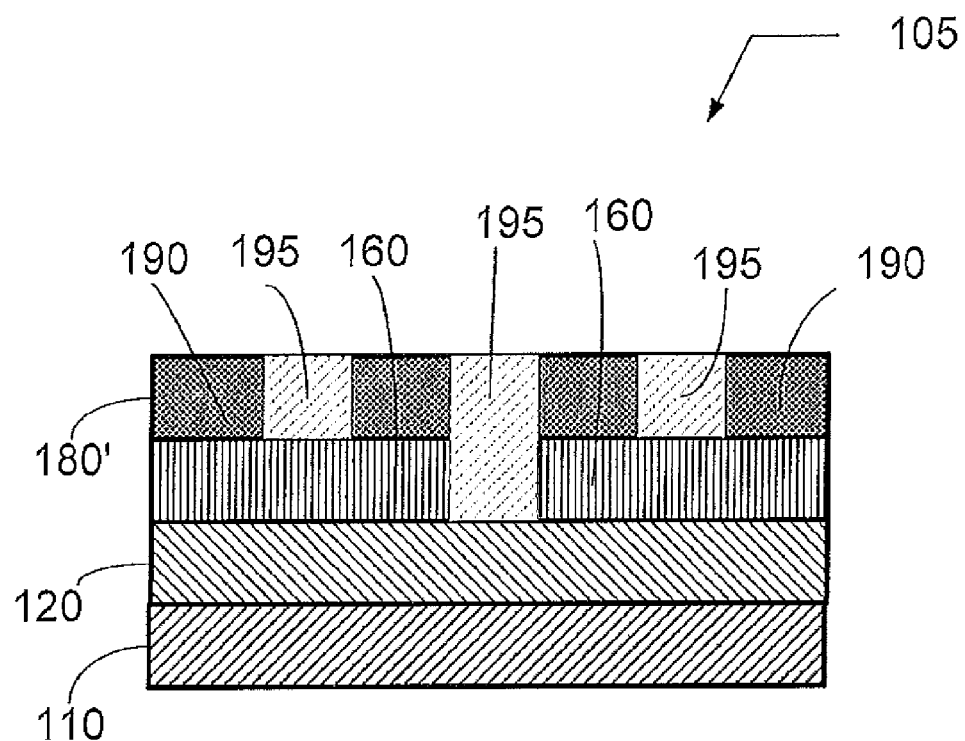
FIG. 1 illustrates a substrate having a block copolymer layer patterned using a directed self assembly (DSA) technique.

Materials and methods for forming a layered substrate comprising a self-assembled material are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a $\chi N$ value, with other polymer blocks of unlike monomer types, that is sufficient for phase separation to occur. $\chi$ is the Flory-Huggins interaction parameter and N is the total degree of polymerization for the block copolymer. According to embodiments of the present invention, the $\chi N$ value of one polymer block with at least one other polymer block in the larger copolymer may be equal to or greater than about 10.5.

As used herein, the term "block copolymer" means and includes a polymer composed of chains where each chain contains two or more polymer blocks as defined above and at least two of the blocks are of sufficient segregation strength (e.g., $\chi N>10.5$) for those blocks to phase separate. A wide variety of block polymers are contemplated herein including di-block copolymers (i.e., polymers including two polymer blocks (AB)), tri-block copolymers (i.e., polymers including three polymer blocks (ABA or ABC)), multi-block copolymers (i.e., polymers including more than three polymer blocks (ABCD, etc.)), and combinations thereof.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The terms "microphase segregation" and "microphase separation," as used herein mean and include the properties by which homogeneous blocks of a block copolymer aggregate mutually, and heterogeneous blocks separate into distinct domains. In the bulk, block copolymers can self assemble into ordered morphologies, having spherical, cylindrical, lamellar, bicontinuous gyroid, or miktoarm star microdomains, where the molecular weight of the block copolymer dictates the sizes of the microdomains formed.

The domain size or pitch period ($L_0$) of the self-assembled block copolymer morphology may be used as a basis for designing critical dimensions of the patterned structure. Similarly, the structure period ($L_S$), which is the dimension of the feature remaining after selectively etching away one of the polymer blocks of the block copolymer, may be used as a basis for designing critical dimensions of the patterned structure. The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by various methods known in the art, including, but not limited to; thermal annealing (either in a vacuum or in an inert atmosphere, such as nitrogen or argon), solvent vapor-assisted annealing (either at or above room temperature), supercritical fluid-assisted annealing, or absorption-based annealing (e.g., optical baking). As a specific example, thermal annealing of the block copolymer may be conducted by exposing the block copolymer to an elevated temperature that is above the glass transition temperature ($T_g$), but below the degradation temperature ($T_d$) of the block copolymer, as described in greater detail hereinafter. Other conventional annealing methods not described herein may also be utilized.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that like blocks aggregate together, thereby forming alternating regions containing each block type or species. For example, if the copolymers are formed of polar (e.g., organometallic-containing polymers) and non-polar blocks (e.g., hydrocarbon polymers), the blocks will segregate so that non-polar blocks aggregate with other non-polar blocks and polar blocks aggregate with other polar blocks. It will be appreciated that the block copolymers may be described as a self-assembling material since the blocks can move to form a pattern without active application of an external force to direct the movement of particular individual molecules, although heat may be applied to increase the rate of movement of the population of molecules as a whole.

In addition to interactions between the polymer block species, the self-assembly of block copolymers can be influenced by topographical features, such as steps or guides extending perpendicularly from the horizontal surface on which the block copolymers are deposited. For example, a di-block copolymer, a copolymer formed of two different polymer block species, may form alternating domains, or regions, which are each formed of a substantially different polymer block species. When self-assembly of polymer block species occurs in the area between the perpendicular walls of a step or guides, the steps or guides may interact with the polymer blocks such that, e.g., each of the alternating regions formed by the blocks is made to form a regularly spaced apart pattern with features oriented generally parallel to the walls and the horizontal surface.

Such self-assembly can be useful in forming masks for patterning features during semiconductor fabrication processes. For example, one of the alternating domains may be removed, thereby leaving the material forming the other region to function as a mask. The mask may be used to pattern features such as electrical devices in an underlying semiconductor substrate. Methods for forming a block copolymer mask are disclosed in U.S. Pat. No. 7,579,278; U.S. Pat. No. 7,723,009, and U.S. application Ser. No. 13/830,859, CHEMI-EPITAXY IN DIRECTED SELF-ASSEMBLY APPLICATIONS USING PHOTO-DECOMPOSABLE AGENTS, by Somervell et al., filed on Mar. 14, 2013, the entire disclosure of each of which is incorporated by reference herein.

FIG. 1 illustrates a substrate having a block copolymer layer patterned using a directed self assembly (DSA) technique. With reference to FIG. 1, a layer of the block copolymer 180 was applied and allowed to self-assemble to form a mask pattern over the exposed first layer of material 120 and the cross-linked portion of radiation sensitive material 160. The block copolymer comprises at least two polymer blocks, which may be selectively etched relative to one another, i.e., the block copolymer has an etch selectivity greater than 2 under a first set of etching conditions. Furthermore, the block copolymer can self-organize in a desired and predictable manner, e.g., the polymer blocks are immiscible and will segregate under appropriate conditions to form domains predominantly containing a single block species.

The block copolymers may be deposited by various methods, including, e.g., spin-on coating, spin casting, brush coating or vapor deposition. For example, the block copolymer may be provided as a solution in a carrier solvent such as an organic solvent, e.g., toluene. The solution of the block copolymer can be applied to the layered structure and the carrier solvent subsequently removed to provide the layer of block copolymer 180. While the invention is not bound by theory, it will be appreciated that the different block species are understood to self-aggregate due to thermodynamic considerations in a process similar to the phase separation of materials. The self-organization is guided by the physical interfaces of mask feature, as well as the chemical affinity between the chemical species of the underlying first layer of material 120 and at least one of the polymer blocks within the block copolymer chain. Accordingly, the constituent blocks of the block copolymers can orient themselves along the length of the cross-linked portion of radiation sensitive material 160 due to interfacial interactions and chemical affinities.

With continued reference to FIG. 1, the layer of the block copolymer 180 is exposed to annealing conditions to facilitate the self-assembly of the block copolymer into a plurality of alternating domains 190, 195 aligned side-by-side between the spaced cross-linked portions of radiation sensitive material 160. In this exemplary embodiment, shown in FIG. 1, the layer of self-assembled block polymer 180 has domains 190, 195 that are arranged where the first layer of material 120 has a chemical affinity for the polymer block comprising domain 195. Accordingly, the chemical affinity between one of the polymer blocks of the block copolymer and the first layer of material 120 acts to pin the domain 195 into the feature 170. Conversely, if the chemical affinity is neutral between the cross-linked portion of the radiation sensitive material 160 and the polymer blocks of the block copolymer, both domains 190, 195 may self-organize across this neutral surface, which advantageously provides frequency multiplication. In the embodiment shown in FIG. 1, a 3× frequency multiplication is shown. It should be appreciated that other frequency multiplications may be obtained ranging from 1-10×. In the case of 1× frequency multiplication, the neutral layer can also be made chemically attractive to the block that comprises domain 190 and so further increase the chemical driving force for assembly.

It should be appreciated that the dimension of the pinning region (e.g., the dimension of feature 170 in the instant embodiment) can be designed to correlate to the $L_0$ of the self-assembled block copolymer morphology. If the pinning region is about $L_0/2$, it will effectively match the size of one of the blocks of the block copolymer. Pinning regions of about $3L_0/2$ will also effectively serve to pin one of the blocks of the block copolymer. Accordingly, according to one aspect of the present invention, the method also includes preparing a feature having a dimension that is in a range from about 0.30 $L_0$ to about 0.9 $L_0$; or from about 1.25 $L_0$ to about 1.6 $L_0$.

The self-organization may be facilitated and accelerated by annealing the layered structure 105 shown in FIG. 1. The temperature of the annealing process may be chosen to be sufficiently low to prevent adversely affecting the block copolymers or the layered structure. The anneal may be performed at a temperature of less than about 150° C., less than about 300° C., less than about 250° C., less than about 200° C. or about 180° C. in some embodiments. According to another embodiment, the annealing process may include a solvent anneal, which generally reduces the annealing temperature. Traditional solvent annealing methods can be used, as well as newer techniques such as that disclosed in U.S. patent application Ser. No. 13/843,122, filed on Mar. 15, 2013 entitled SOLVENT ANNEAL PROCESSING FOR DIRECTED-SELF ASSEMBLY APPLICATIONS, which is incorporated herein by reference in its entirety.

According to one aspect, in order to facilitate faster annealing times without oxidizing or burning the organic polymer block of the block copolymer, the annealing may be performed in a low oxygen atmosphere at annealing temperature greater than about 250° C. in less than about 1 hour of anneal time. As used herein, the low oxygen atmosphere comprises less than about 50 ppm oxygen. For example, the low oxygen atmosphere may include less than about 45 ppm, less than about 40 ppm, less than about 35 ppm, less than about 30 ppm, less than about 25 ppm, less than about 20 ppm, or ranges in between thereof. Additionally, the low oxygen atmosphere annealing methods may be accompanied by thermal quenching methods. Exemplary low oxygen atmosphere and thermal quenching annealing methods are disclosed in U.S. Patent Application Ser. No. 61/793,204, filed on Mar. 15, 2013 entitled MULTI-STEP BAKE APPARATUS AND METHOD FOR DIRECTED SELF-ASSEMBLY LITHOGRAPHY CONTROL, which is incorporated herein by reference in its entirety.

The anneal time may range from about several hours to about 1 minute. For example, annealing times for temperatures above 250° C. may range from about 1 hour to about 2 minutes, from about 30 minutes to about 2 minutes, or from about 5 minutes to about 2 minutes. According to one embodiment, the annealing temperature may be within the range from about 260° C. to about 350° C., wherein the low oxygen atmosphere comprises less than about 40 ppm oxygen. For example, the layer of the block copolymer 180 may be exposed to annealing conditions of 310° C. in less than about 40 ppm oxygen for about a 2 minutes to about 5 minutes.

Accordingly, the annealing step of the layer of block copolymer forms a layer of self-assembled block polymer 180 having a first domain 190 that is formed of one polymer block, and sandwiched by domains 195 that are formed of another block polymer. Further, based on the intrinsic etch selectivity provided by the choice of the appropriate polymer blocks, it will be appreciated that one of the domains may be selectively removed in a single step using a single etch chemistry or may be removed using multiple etches with different etch chemistries.

For example, where the domains 190 are formed of polystyrene (PS) and the domain 195 is formed of polymethyl methacrylate (PMMA), the PMMA domain 195 may be removed by performing a selective oxygen plasma etch, which also partially oxidizes the PS domain features 190, which remain. It will be appreciated that the dimensions of the resulting features may vary, depending on the size of the copolymer used and process conditions. It should be further appreciated that domain phases other than the lamellar phases shown in FIG. 1 are also contemplated, and therefore the present invention is not limited thereto.

As mentioned above, conventional etching techniques have produced pattern defectivity, such as line edge roughness/line width (LER/LWR), that are unacceptable and in extreme cases, the defectivity of the PS is catastrophic due to pattern collapse. FIG. 2A depicts simplified schematic representations, 200 and 220, of the result of a prior art conventional method of an etching process for a patterned DSA layer resulting in defectivity of structures. FIG. 2A includes a side-view 200 and a top-view 220 after a conventional etch process of a PS DSA pattern. The side view 200 depicts a substrate 208 where some features 216 show substantial line edge roughness and where adjacent features 212 are touching each other and showing more damage to the sidewalls of the features 212. The top-view 220 of the pattern depicts the two adjacent features 212 that are touching at a point 214 in the dotted circle 224; the touching of two or more adjacent features is also known as bridging.

FIG. 2B depicts simplified schematic representations, 240 and 260, of the result of a prior art conventional method of an etching process for a patterned DSA layer resulting in pattern collapse of the structures. The side view 240 depicts a substrate 246 where two or more adjacent features 242 are damaged and the features are not individually distinguishable, i.e. a pattern collapse. The top-view 260 depict the features are mixed up in a manner that would cause the pattern to be unusable for its intended purpose.

Figure 3:
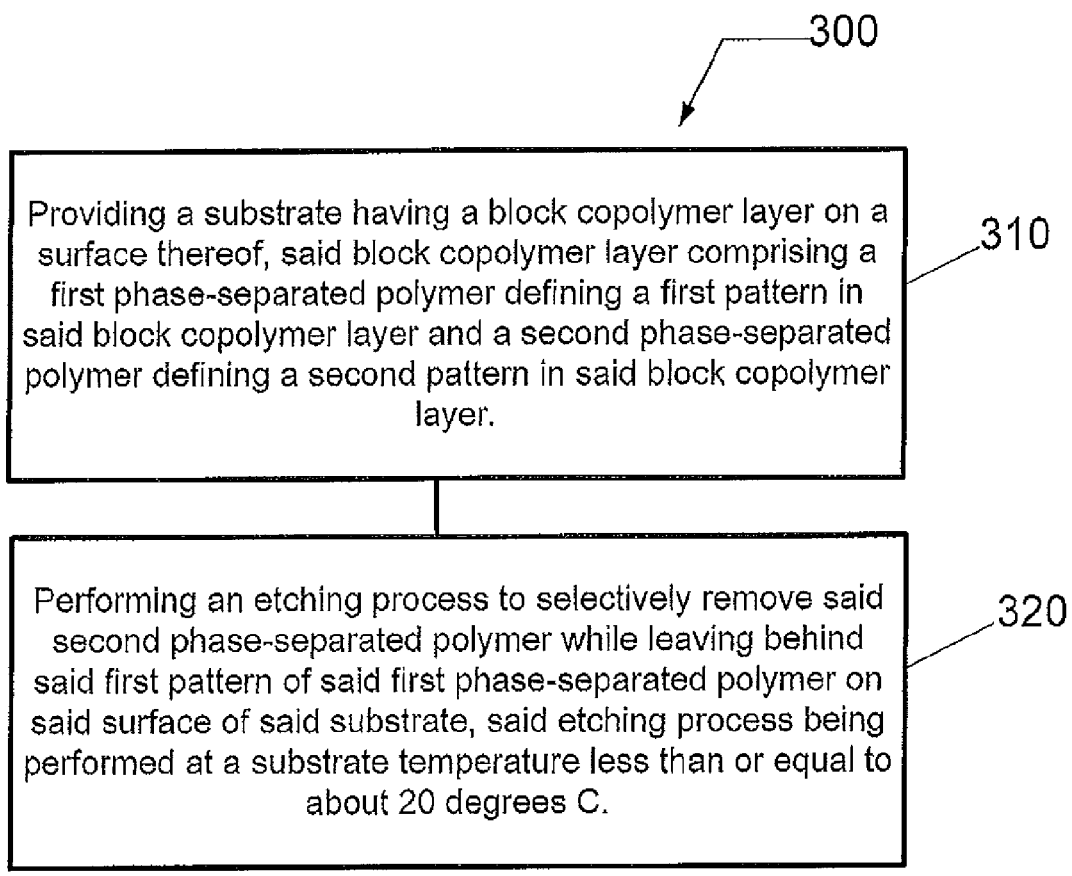
FIG. 3 is a flow chart illustrating an exemplary method for reducing DSA pattern defectivity of the block copolymer layer, in accordance with an embodiment of the present invention.

FIG. 3 is a flow chart 300 illustrating an exemplary method for reducing DSA pattern defectivity of the block copolymer layer, in accordance with an embodiment of the present invention. In operation 310, a substrate having a block copolymer layer on a surface thereof is provided, the block copolymer layer comprising a first phase-separated polymer defining a first pattern in the block copolymer layer and a second phase-separated polymer defining a second pattern in the block copolymer layer. The substrate can be manufactured with the process described in relation to FIG. 1. The block copolymer can comprise a di-block copolymer, a tri-block copolymer, or a tetra-block copolymer. As mentioned above, in an embodiment, the block copolymer layer comprises polystyrene-b-poly(methyl methacrylate). Other block copolymer layers can also be used.

Still referring to FIG. 3, in operation 310, the first phase-separated polymer can be polystyrene (PS) and the second phase-separated polymer can be poly(methyl methacrylate) (PMMA). Other polymers can also be used. The glass transition temperature of the first phase-separated polymer and the substrate temperature are key variables for controlling the results of the etching process. In an embodiment, the first phase-separated polymer includes polystyrene and the second phase-separated polymer includes poly (methyl methacrylate). The glass transition temperature can be adjusted by a controlling one or more operating parameters for fabricating the copolymer resulting in a glass transition temperature within a target glass transition temperature range, where the one of more operating parameters is selected from a group including cooling rate or heating rate of the substrate, degree of crosslinking, degree of copolymerization, copolymer molecular size, percent of plasticizers in copolymer, annealing temperature, or pressure used in the copolymer fabrication. One or more of the glass transition temperature parameters are controlled to fabricate a substrate with an acceptable value or range of values of the glass transition temperatures for the copolymer application. In an embodiment, the first phase-separated polymer has a glass transition greater temperature than 50 degrees C., a range from about 50 degrees C. to about 100 degrees C., or about 80 degrees C. to about 100 degrees C.

In operation, 320, an etching process is performed to selectively remove the second phase-separated polymer while leaving behind the first pattern of the first phase-separated polymer on the surface of the substrate, the etching process being performed at a substrate temperature less than or equal to about 20 degrees C. In an embodiment, the substrate temperature can be less than or equal to about 10 degrees C. In another embodiment, performing the etching process includes forming plasma from a process composition containing an oxygen-containing gas and a noble gas. In still another embodiment, the plasma is formed from a process composition containing an oxygen-containing gas and argon. The process composition containing $O_2$ and Ar can be provided at a flow rate ratio of $O_2$ to Ar of about 0.08 to about 0.10.

Still referring to operation 320, etching process method further comprises exposing the first phase-separated polymer to an electron beam. In another embodiment, the etching process method is performed wherein the exposure to the electron beam is performed during the performing the etching process, or following the performing the etching process, or both. In an alternative embodiment, the performing the etching process comprises forming plasma between a lower electrode, upon which the substrate is placed, and an upper electrode, disposed opposite the lower electrode, and coupling a negative DC voltage to the upper electrode.

Defectivity is measured in terms of pattern collapse metrics and pattern roughness metrics. Measurement of the pattern collapse metrics and pattern roughness metrics can be performed after or during the etching process using optical metrology tools and/or process metrology tool. The pattern collapse metrics can be a percentage of features in a measurement area that collapsed. Pattern defectivity can also include line edge roughness of one or more edges of a feature in a pattern. For example, a line edge roughness for a first edge such as line edge roughness-right (LERR) and line edge roughness-left (LERL) can be measured using optical metrology tool such reflectometers, ellipsometers, scanning electron microscopes (SEM), and the like. Operation 320 can include a process step wherein the performing the etching process includes controlling pattern defectivity, the pattern defectivity including pattern roughness metrics of the first pattern. The measurements can be pattern roughness metrics which can include a mean value of line width roughness, a line width roughness for a first edge of the first pattern, and a line edge roughness for a second edge of the first pattern. For example, the mean value of the line width roughness can be 3.0 nm or less, line width roughness-left can be 3.5 nm or less, and line width roughness-right can be 3.5 nm or less.

Figure 4:
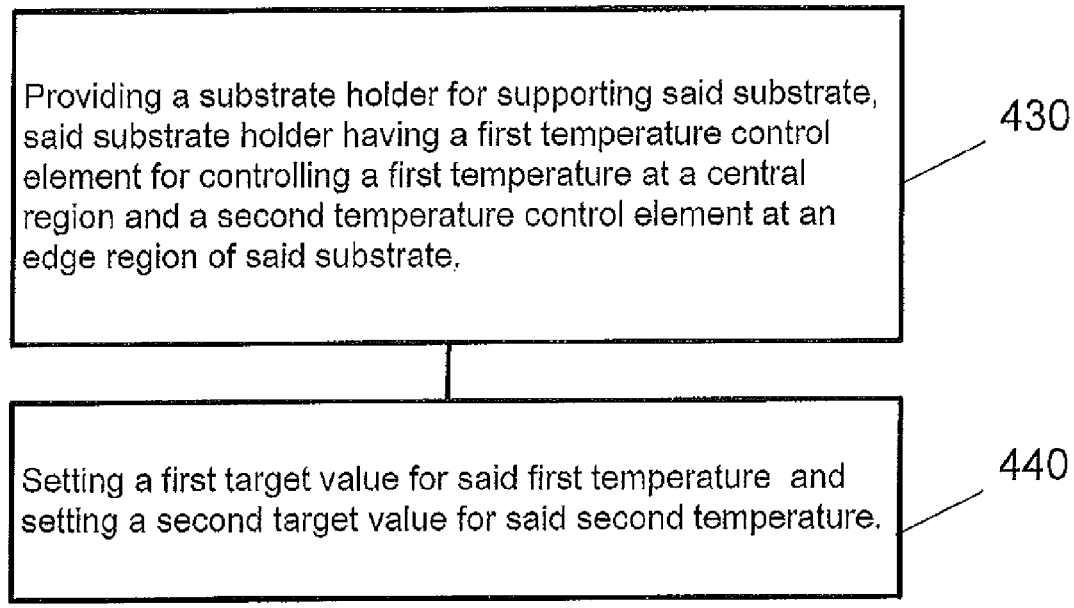
FIG. 4 is a flow chart illustrating further exemplary method operations for reducing DSA pattern defectivity of the block copolymer layer, in accordance with an embodiment of the present invention.

FIG. 4 is a flow chart illustrating additional exemplary method steps for reducing DSA pattern defectivity of the block copolymer layer, in accordance with an embodiment of the present invention. After operations 310 and 320 in FIG. 3, in operation 430 of FIG. 4, a substrate holder for supporting the substrate is provided where the substrate holder has a first temperature control element for controlling a first temperature at a central region of the substrate and second temperature control element at an edge region of the substrate. In operation 440, in an embodiment, the first temperature can be at or below about 20 degrees C. and the second temperature be set at or below about 10 degrees C. In another embodiment, the first temperature control element for controlling a first temperature at a central region and second temperature control element at an edge region of the substrate; setting a target value for the first temperature at or below about 10 degrees C.; and setting a target value for the second temperature at or below about 0 degrees C.

Figure 5:
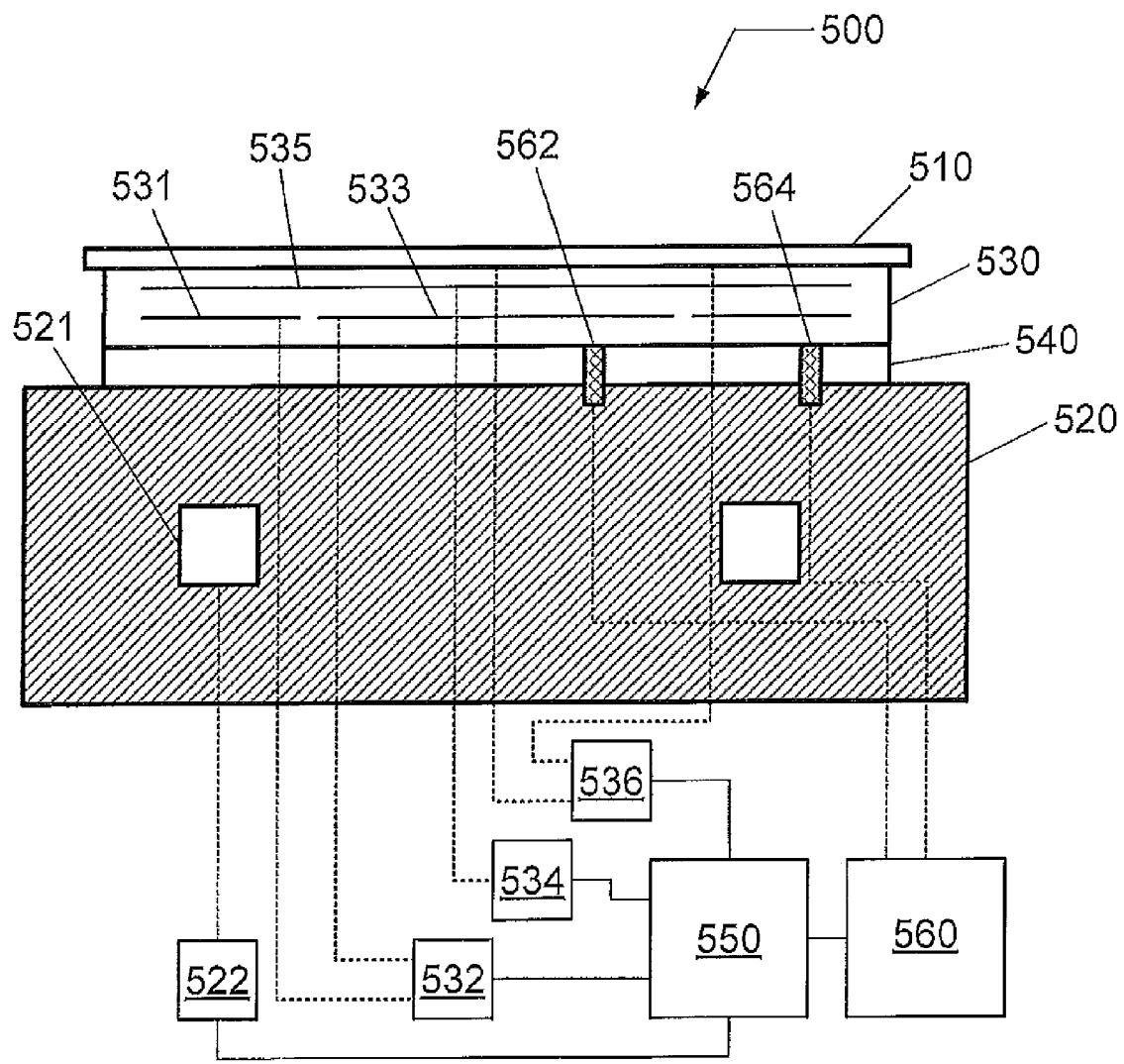
FIG. 5 is a simplified schematic diagram of a substrate holder in accordance with an embodiment of the present invention.

FIG. 5 is a simplified schematic diagram 500 of a substrate holder in accordance with an embodiment of the present invention. Referring now to FIG. 5, a temperature controlled substrate holder 500 for use in an etching system configured to be used in operation 430 referred to in FIG. 4 above. The substrate holder 500 comprises a substrate support 530 having a first temperature and configured to support a substrate 510, a temperature-controlled support base 520 positioned below substrate support 530 and configured to be at a second temperature less than the first temperature (e.g. less than a desired temperature of substrate 510), and a thermal insulator 540 disposed between the substrate support 530 and the temperature-controlled support base 520. Additionally, the substrate support 530 comprises a center heating element 533 (located at a substantially center region below substrate 510)

and an edge heating element 531 (located at a substantially edge, or peripheral, region below substrate 510) coupled thereto, and configured to elevate the temperature of the substrate support 530. Furthermore, the support base 520 comprises one or more cooling elements 521 coupled thereto, and configured to reduce the temperature of the substrate support 530 via the removal of heat from the substrate support 530 through thermal insulator 540.

As shown in FIG. 5, the center heating element 533 and the edge heating element 531 are coupled to a heating element control unit 532. Heating element control unit 532 is configured to provide either dependent or independent control of each heating element, and exchange information with a controller 550. The center heating element 533 and the edge heating element 531 may comprise at least one of a heating fluid channel, a resistive heating element, or a thermo-electric element biased to transfer heat towards the wafer.

For example, the center heating element 533 and the edge heating element 531 may comprise one or more heating channels that can permit flow of a fluid, such as water, FLUORINERT, GALDEN HT-135, etc., there through in order to provide conductive-convective heating, wherein the fluid temperature has been elevated via a heat exchanger. The fluid flow rate and fluid temperature can, for example, be set, monitored, adjusted, and controlled by the heating element control unit 532.

Alternatively, for example, the center heating element 533 and the edge heating element 531 may comprise one or more resistive heating elements such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). For example, the heating elements can comprise a cast-in heater commercially available from Watlow (1310 Kingsland Dr., Batavia, Ill., 60510) capable of a maximum operating temperature of 400 to 450 degrees C., or a film heater comprising aluminum nitride materials that is also commercially available from Watlow and capable of operating temperatures as high as 300 degrees C. and power densities of up to 23.25 W/cm$^2$. Additionally, for example, the heating element can comprise a silicone rubber heater (1.0 mm thick) capable of 1400 W (or power density of 5 W/in$^2$). When an electrical current flows through the filament, power is dissipated as heat, and, therefore, the heating element control unit 532 can, for example, comprise a controllable DC power supply. A further heater option, suitable for lower temperatures and power densities, are Kapton heaters, consisted of a filament embedded in a Kapton (e.g. polyimide) sheet, marketed by Minco, Inc., of Minneapolis, Minn.

Alternately, for example, the center heating element 533 and the edge heating element 531 can comprise an array of thermo-electric elements capable of heating or cooling a substrate depending upon the direction of electrical current flow through the respective elements. Thus, while the center heating element 533 and the edge heating element 531 are referred to as "heating elements," these elements may include the capability of cooling in order to provide rapid transition between temperatures. Further, heating and cooling functions may be provided by separate elements within the substrate support 530. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). Therefore, the heating element control unit 532 can, for example, comprise a controllable current source.

The one or more cooling elements 521 can comprise at least one of a cooling channel, or a thermo-electric element. Furthermore, the one or more cooling elements 521 are coupled to a cooling element control unit 522. Cooling element control unit 522 is configured to provide dependent or independent control of each cooling element 521, and exchange information with controller 550.

For example, the one or more cooling elements 521 can comprise one or more cooling channels that can permit flow of a fluid, such as water, FLUORINERT, GALDEN HT-135, etc., there through in order to provide conductive-convective cooling, wherein the fluid temperature has been lowered via a heat exchanger. The fluid flow rate and fluid temperature can, for example, be set, monitored, adjusted, and controlled by the cooling element control unit 522. Alternately, during heating for example, the fluid temperature of the fluid flow through the one or more cooling elements 521 may be increased to complement the heating by the center heating element 533 and the edge heating element 531. Alternately yet, during cooling for example, the fluid temperature of the fluid flow through the one or more cooling elements 521 may be decreased.

Alternatively, for example, the one or more cooling elements 521 can comprise an array of thermo-electric elements capable of heating or cooling a substrate depending upon the direction of electrical current flow through the respective elements. Thus, while the elements 521 are referred to as "cooling elements," these elements may include the capability of heating in order to provide rapid transition between temperatures. Further, heating and cooling function may be provided by separate elements within the temperature controlled support base 520. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). Therefore, the cooling element control unit 522 can, for example, comprise a controllable current source.

Additionally, as shown in FIG. 5, the substrate holder 500 may further comprise an electrostatic clamp (ESC) comprising one or more clamping electrodes 535 embedded within substrate support 530. The ESC further comprises a high-voltage (HV) DC voltage supply 534 coupled to the clamping electrodes 535 via an electrical connection. The design and implementation of such a clamp is well known to those skilled in the art of electrostatic clamping systems. Furthermore, the HV DC voltage supply 534 is coupled to controller 550 and is configured to exchange information with controller 550.

Furthermore, the substrate holder 500 can further comprise a back-side gas supply system 536 for supplying a heat transfer gas, such as an inert gas including helium, argon, xenon, krypton, a process gas, or other gas including oxygen, nitrogen, or hydrogen, to the center region and the edge region of the backside of substrate 510 through two gas supply lines, and at least two of a plurality of orifices and channels (not shown). The backside gas supply system 536, as shown, comprises a two-zone (center/edge) system, wherein the backside pressure can be varied in a radial direction from the center to edge. Furthermore, the backside gas supply system 536 is coupled to controller 550 and is configured to exchange information with controller 550.

Further yet, as shown in FIG. 5, the substrate holder 500 further comprises a center temperature sensor 562 for measuring a temperature at a substantially center region below substrate 510 and an edge temperature sensor 564 for measuring a temperature at a substantially edge region below substrate 510. The center and edge temperature sensors 562, 564 are coupled to a temperature monitoring system 560.

The temperature sensor can include an optical fiber thermometer, an optical pyrometer, a band-edge temperature measurement system as described in U.S. Pat. No. 6,891,124, the contents of which are incorporated herein by reference in their entirety, or a thermocouple (as indicated by the dashed line) such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

The temperature monitoring system 560 may provide sensor information to controller 550 in order to adjust at least one of a heating element, a cooling element, a backside gas supply system, or an HV DC voltage supply for an ESC before, during, or after processing.

Controller 550 includes a microprocessor, memory, and a digital I/O port (potentially including D/A and/or A/D converters) capable of generating control voltages sufficient to communicate and activate inputs to substrate holder 500 as well as monitor outputs from substrate holder 500. As shown in FIG. 5, controller 550 can be coupled to and exchange information with heating element control unit 532, cooling element control unit 522, HV DC voltage supply 534, backside gas supply system 536, and temperature monitoring system 560. A program stored in the memory is utilized to interact with the aforementioned components of substrate holder 500 according to a stored process recipe.

The controller 550 may also be implemented as a general purpose computer, processor, digital signal processor, etc., which causes a substrate holder to perform a portion or all of the processing steps of the invention in response to the controller 550 executing one or more sequences of one or more instructions contained in a computer readable medium. The computer readable medium or memory is configured to hold instructions programmed according to the teachings of the invention and can contain data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Controller 550 may be locally located relative to the substrate holder 500, or it may be remotely located relative to the substrate holder 500 via an internet or intranet. Thus, controller 550 can exchange data with the substrate holder 500 using at least one of a direct connection, an intranet, or the internet. Controller 550 may be coupled to an intranet at a customer site (i.e., a device maker, etc.), or coupled to an intranet at a vendor site (i.e., an equipment manufacturer). Furthermore, another computer (i.e., controller, server, etc.) can access controller 550 to exchange data via at least one of a direct connection, an intranet, or the internet.

Optionally, substrate holder 500 can include an electrode through which RF power is coupled to plasma in a processing region above substrate 510. For example, support base 520 can be electrically biased at an RF voltage via the transmission of RF power from an RF generator through an impedance match network to substrate holder 500. The RF bias can serve to heat electrons to form and maintain plasma, or bias substrate 510 in order to control ion energy incident on substrate 510, or both. In this configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, an impedance match network can serve to maximize the transfer of RF power to plasma in the processing chamber by minimizing the reflected power. Various match network topologies (e.g., L-type, pi-type, T-type, etc.) and automatic control methods can be utilized.

Additional details for the design of a temperature controlled substrate holder configured for rapid and uniform control of substrate temperature are provided in U.S. Patent Application Publication No. 2008/0083723; U.S. Patent Application Publication No. 2010/0078424; U.S. Patent Application Publication No. 2008/0083724; U.S. Patent Application Publication No. 2008/0073335; U.S. Pat. No. 7,297,894; U.S. Pat. No. 7,557,328; and U.S. Patent Application Publication No. 2009/0266809.

In one embodiment, the first, second, and/or third etch process may comprise a process parameter space that includes: a chamber pressure ranging up to about 1000 mTorr (milli-Torr) (e.g., up to about 100 mTorr, or up to about 10 to 30 mTorr), a process gas flow rate ranging up to about 2000 sccm (standard cubic centimeters per minute) (e.g., up to about 1000 sccm, or about 1 sccm to about 100 sccm, or about 1 sccm to about 20 sccm, or about 15 sccm), an additive gas process gas flow rate ranging up to about 2000 sccm (e.g., up to about 1000 sccm, or about 1 sccm to about 20 sccm, or about 10 sccm), an upper electrode RE bias ranging up to about 2000 W (watts) (e.g., up to about 1000 W, or up to about 500 W), and a lower electrode RF bias ranging up to about 1000 W (e.g., up to about 600 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In another alternate embodiment, RF power is supplied to the upper electrode and not the lower electrode. In another alternate embodiment, RF power is supplied to the lower electrode and not the upper electrode. The time duration to perform a specific etch process may be determined using design of experiment (DOE) techniques or prior experience; however, it may also be determined using endpoint detection. One possible method of endpoint detection is to monitor a portion of the emitted light spectrum from the plasma region that indicates when a change in plasma chemistry occurs due to change or substantially near completion of the removal of a particular material layer from the substrate and contact with the underlying thin film. After emission levels corresponding to the monitored wavelengths cross a specified threshold (e.g., drop to substantially zero, drop below a particular level, or increase above a particular level), an endpoint can be considered to be reached. Various wavelengths, specific to the etch chemistry being used and the material layer being etched, may be used. Furthermore, the etch time can be extended to include a period of over-etch, wherein the over-etch period constitutes a fraction (i.e., 1 to 100%) of the time between initiation of the etch process and the time associated with endpoint detection.

One or more of the etch processes may be performed utilizing a plasma etching system. Furthermore, one or more of the etch processes may be performed utilizing a temperature controlled substrate holder in a plasma etching system such as the one described in FIG. 5. However, the methods discussed are not to be limited in scope by this exemplary presentation.

Figure 6:
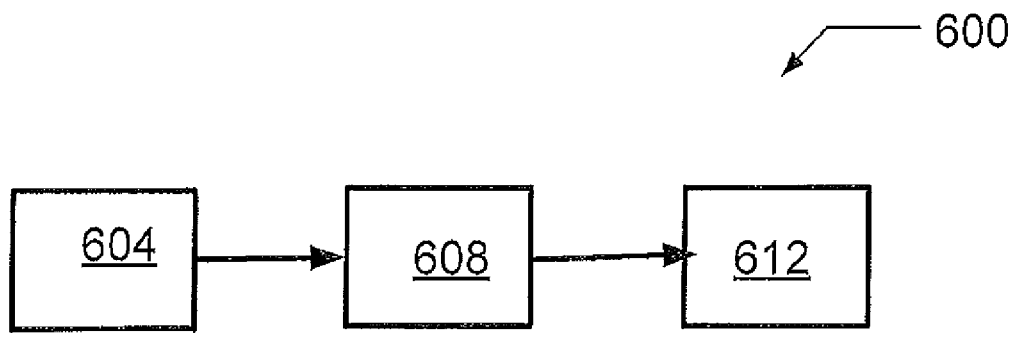
FIG. 6 is an exemplary architectural diagram of the fabrication processes involved in manufacturing sequences in an embodiment of the present invention.

FIG. 6 is an exemplary simplified architectural diagram 600 of the fabrication processes involved in manufacturing sequences in an embodiment of the present invention. As discussed above and in reference to FIG. 6, the process of providing the substrate having a block copolymer layer can be performed in two distinct process sequences, namely, a first process sequence 604 where the substrate is coated with a block copolymer and a second process sequence 608 where the substrate is annealed, as discussed in connection with operations 310 of FIG. 3. The first process sequence 604 comprises applying a first phase-separated polymer defining a first pattern in the block copolymer layer and a second phase-separated polymer defining a second pattern in the block copolymer layer. The second process sequence 608 includes exposing the block copolymer to annealing conditions to facilitate the self-assembly of the block copolymer into a plurality of alternating domains 190, 195 aligned side-by-side between the spaced cross-linked portions of radiation sensitive material as explained in relation to FIG. 1. A third process sequence 612 includes performing an etching process to selectively remove the second phase-separated polymer while leaving behind the first pattern of the first phase-separated polymer on the surface of the substrate, the etching process being performed at a selected range of low temperatures using, for example, the substrate holder described in relation to FIG. 5.

Figure 7:
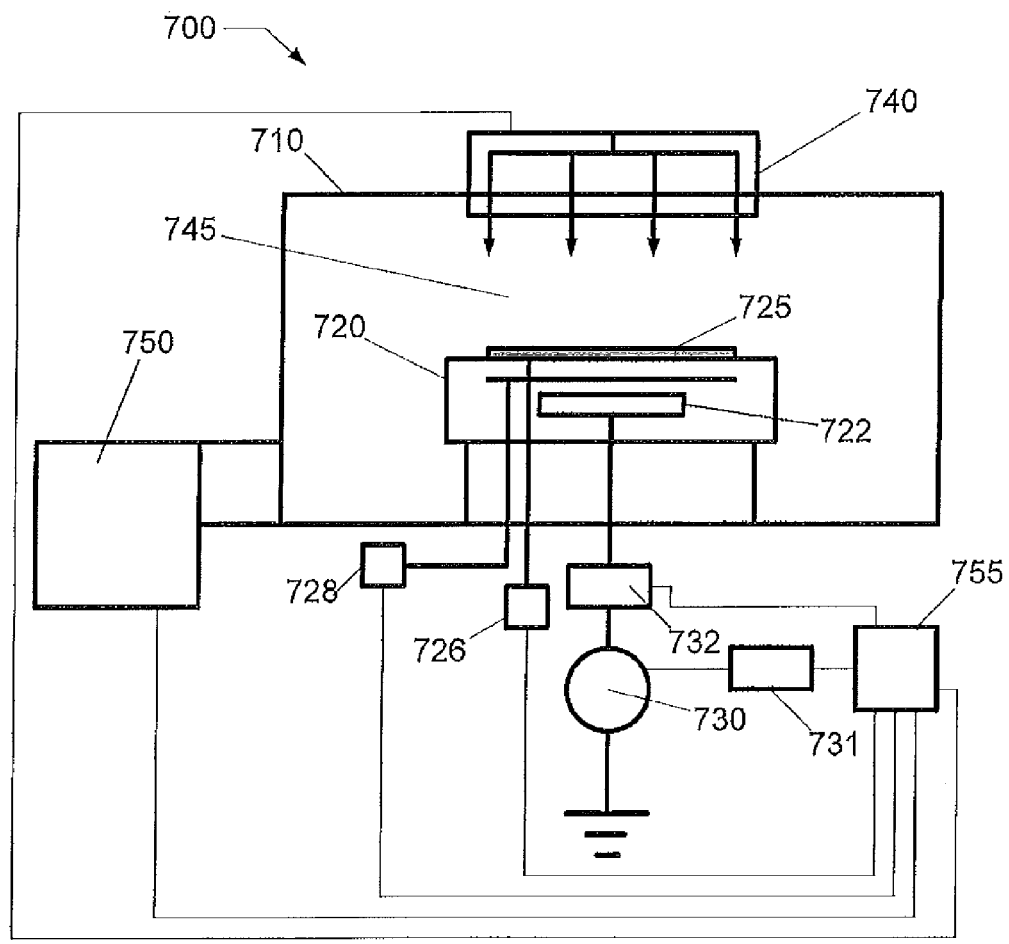
FIG. 7 is an exemplary simplified schematic of a substrate after the etching process utilizing techniques to reduce defectivity of the block copolymer layer in an embodiment of the present invention.

FIG. 7 is an exemplary simplified schematic view 700 of a substrate after the etching process utilizing techniques to reduce defectivity of the block copolymer layer in an embodiment of the present invention. FIG. 7 includes a simplified side view 700 and a simplified top view 720 of a substrate wherein the techniques of reducing defectivity of a block copolymer layer are used during the etching process. Based on tests done using these techniques of controlling the substrate 704 temperature during the etching process, the inventors found that the block copolymer layer structures 708 did not experience pattern collapse. As noted above, pattern collapse is a condition that typically has catastrophic impact to the etched substrates and basically makes the substrates unusable.

Measurements performed during the tests using optical metrology tools, such as ellipsometers, reflectometers, interferometers, or scanning electron microscopes (SEM) and the like, indicated some increase in line edge roughness on the left and right top edges of the features. However, with further cooling of the substrate to very low temperatures and tighter control on the substrate temperature range using the substrate holder depicted in FIG. 5 and/or the control system depicted in FIG. 8, the increase in line edge roughness was within the acceptable target ranges of 3.5 nm or less. In addition, the inventors further found a correlation of the glass transition temperature, $T_g$, to the pattern defectivity. Within a range of $T_g$ from 50 to 100 degrees C., and preferably within 80 to 100 degrees C., there were no pattern collapses and the line edge roughness was within the acceptable target ranges of 3.5 nm or less. The glass transition temperature can be adjusted by a controlling one or more operating parameters for fabricating the copolymer resulting in a glass transition temperature within a target glass transition temperature range, where the one of more operating parameters is selected from a group including cooling rate or heating rate of the substrate, degree of crosslinking, degree of copolymerization, copolymer molecular size, percent of plasticizers in the copolymer, annealing temperature, or the pressure used in the copolymer fabrication.

Figure 8:
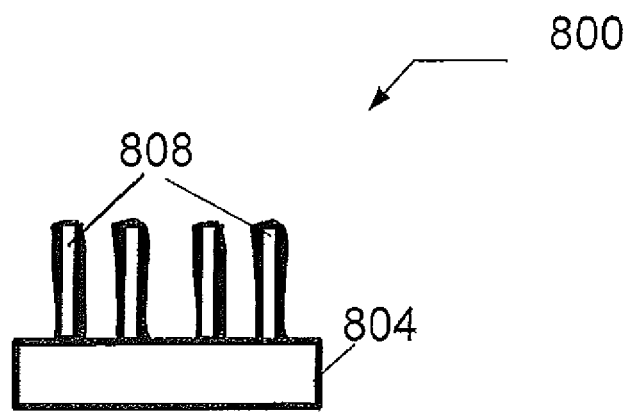
FIG. 8 is an exemplary simplified schematic of a control system used in process sequences to reduce defectivity of the block copolymer layer and controlling one or more operating parameters in one or more process sequences in an embodiment of the present invention.
Figure 8:
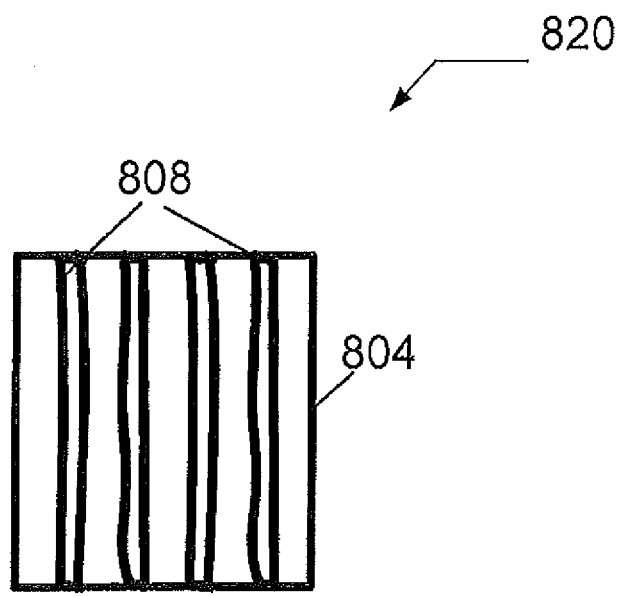

FIG. 8 is an exemplary simplified schematic of a control system used in process sequences to reduce defectivity of the block copolymer layer and controlling one or more operating parameters in one or more process sequences in an embodiment of the present invention. An etch processing system 800 configured to perform the above identified process conditions is depicted in FIG. 8 comprising a plasma processing chamber 810, substrate holder 820, upon which a substrate 825 to be processed is affixed, and vacuum pumping system 850. Substrate 825 can be a semiconductor substrate, a wafer, a flat panel display, or a liquid crystal display. Plasma processing chamber 810 can be configured to facilitate the generation of plasma in plasma processing region 845 in the vicinity of a surface of substrate 825. An ionizable gas or mixture of process gases is introduced via a gas distribution system 840. For a given flow of process gas, the process pressure is adjusted using the vacuum pumping system 850. Plasma can be utilized to create materials specific to a pre-determined materials process, and/or to aid the removal of material from the exposed surfaces of substrate 825. The plasma processing system 800 can be configured to process substrates of any desired size, such as 200 mm substrates, 300 mm substrates, or larger.

Substrate 825 can be affixed to the substrate holder 820 via a clamping system 828, such as a mechanical clamping system or an electrical clamping system (e.g., an electrostatic clamping system). Furthermore, substrate holder 820 can include a heating system (not shown) or a cooling system (not shown) that is configured to adjust and/or control the temperature of substrate holder 820 and substrate 825. The heating system or cooling system may comprise a re-circulating flow of heat transfer fluid that receives heat from substrate holder 820 and transfers heat to a heat exchanger system (not shown) when cooling, or transfers heat from the heat exchanger system to substrate holder 820 when heating. In other embodiments, heating/cooling elements, such as resistive heating elements, or thermo-electric heaters/coolers can be included in the substrate holder 820, as well as the chamber wall of the plasma processing chamber 810 and any other component within the plasma processing system 800.

Additionally, a heat transfer gas can be delivered to the backside of substrate 825 via a backside gas supply system 826 in order to improve the gas-gap thermal conductance between substrate 825 and substrate holder 820. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 825.

In the embodiment shown in FIG. 8, substrate holder 820 can comprise an electrode 822 through which RF power is coupled to the processing plasma in plasma processing region 845. For example, substrate holder 820 can be electrically biased at a RF voltage via the transmission of RF power from a RF generator 830 through an optional impedance match network 832 to substrate holder 820. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 822 at a RF voltage may be pulsed using pulsed bias signal controller 831. The RF power output from the RF generator 830 may be pulsed between an off-state and an on-state, for example. Alternately, RF power is applied to the substrate holder electrode at multiple frequencies. Furthermore, impedance match network 832 can improve the transfer of RF power to plasma in plasma processing chamber 810 by reducing the reflected power. Match network topologies (e.g. L-type, π-type, T-type, etc.) and automatic control methods are well known to those skilled in the art.

Gas distribution system 840 may comprise a showerhead design for introducing a mixture of process gases. Alternatively, gas distribution system 840 may comprise a multi-zone showerhead design for introducing a mixture of process gases and adjusting the distribution of the mixture of process gases above substrate 825. For example, the multi-zone showerhead design may be configured to adjust the process gas flow or composition to a substantially peripheral region above substrate 825 relative to the amount of process gas flow or composition to a substantially central region above substrate 825.

Vacuum pumping system 850 can include a turbo-molecular vacuum pump (TMP) capable of a pumping speed up to about 8000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 810.

As mentioned above, the controller 855 can comprise a microprocessor, memory, and a digital I/O port capable of generating control voltages sufficient to communicate and activate inputs to plasma processing system 800 as well as monitor outputs from plasma processing system 800. Moreover, controller 855 can be coupled to and can exchange information with RF generator 830, pulsed bias signal controller 831, impedance match network 832, the gas distribution system 840, vacuum pumping system 850, as well as the substrate heating/cooling system (not shown), the backside gas supply system 826, and/or the electrostatic clamping system 828. For example, a program stored in the memory can be utilized to activate the inputs to the aforementioned components of plasma processing system 800 according to a process recipe in order to perform a plasma assisted process, such as a plasma etch process, on substrate 825.

Other etch processing systems may include stationary, or mechanically or electrically rotating magnetic field systems, in order to potentially increase plasma density and/or improve plasma processing uniformity, comprise an upper electrode to which RF power can be coupled from RF generator through optional impedance match network, direct current (DC) power supply coupled to the upper electrode opposing the substrate, an inductive coil to which RF power is coupled via RF generator through optional impedance match network, inductive coil that is a "spiral" coil or "pancake" coil in communication with the plasma processing region from above as in a transformer coupled plasma (TCP) reactor, surface wave plasma (SWP) source, and the like. For a more detailed explanation of plasma processing and etch systems, refer to application Ser. No. 13/589,096, filed Aug. 18, 2012, the entire content of which is herein incorporated by reference.

Figure 9:
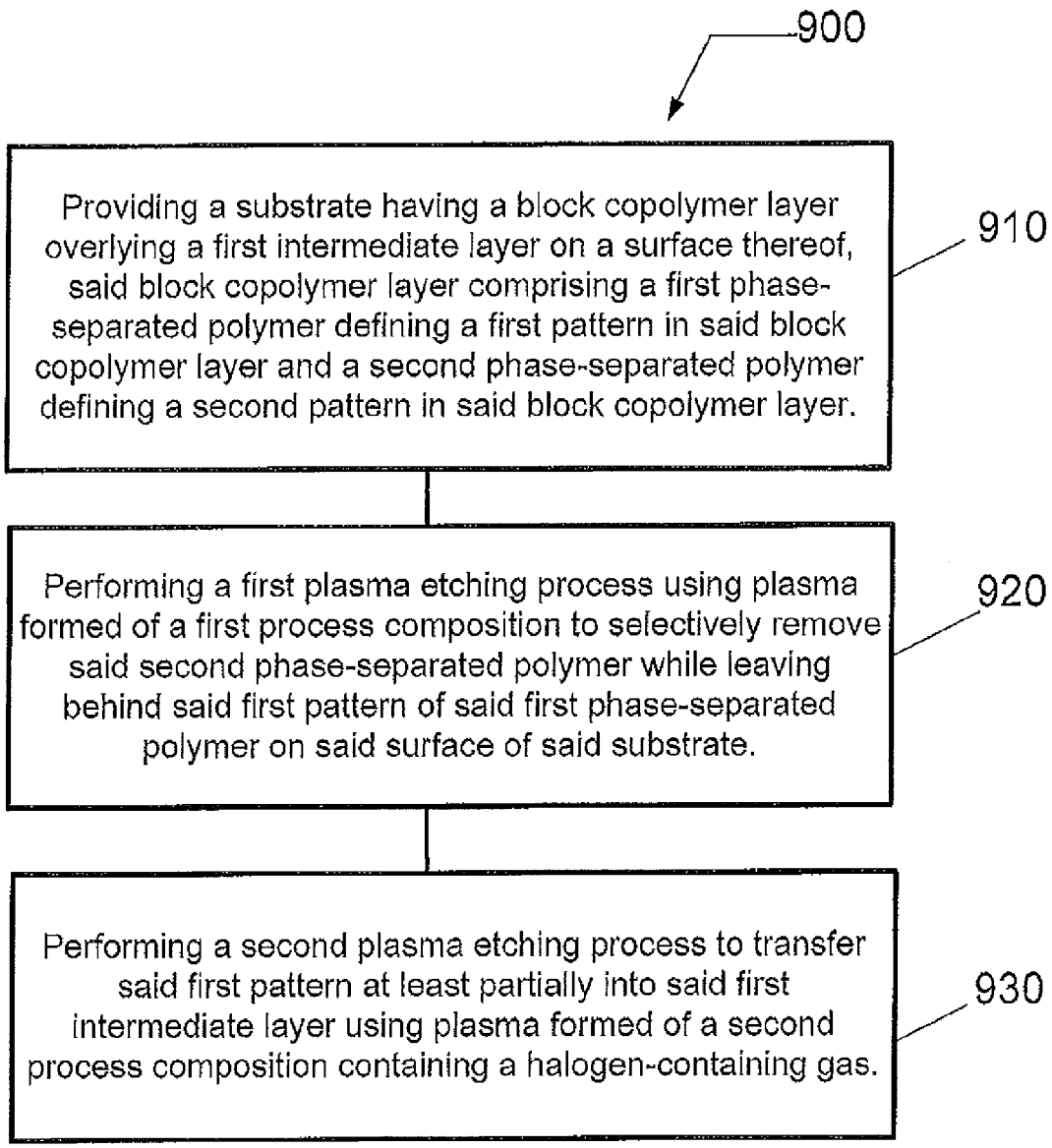
FIG. 9 is an exemplary flow chart illustrating further exemplary method operations for reducing DSA pattern defectivity of the block copolymer layer using direct current superpositioning.

FIG. 9 is an exemplary flow chart 900 illustrating an exemplary method for reducing DSA pattern defectivity of a block copolymer layer using direct current superpositioning. In operation 910, a substrate is provided having a block copolymer layer overlying a first intermediate layer on a surface thereof, said block copolymer layer comprising a first phase-separated polymer defining a first pattern in said block copolymer layer and a second phase-separated polymer defining a second pattern in said block copolymer layer. As mentioned above, the block copolymer can comprise a di-block copolymer, a tri-block copolymer, or a tetra-block copolymer. The block copolymer layer can comprises polystyrene-b-poly(methyl methacrylate). Other block copolymer layers can also be used. The first phase-separated polymer can be polystyrene (PS) and the second phase-separated polymer can be poly(methyl methacrylate) (PMMA). Other polymers can also be used. The glass transition temperature of the first phase-separated polymer and the substrate temperature are key variables for controlling the results of the etching process. In an embodiment, the first phase-separated polymer includes polystyrene and the second phase-separated polymer includes poly (methyl methacrylate). Also as mentioned above, one or more of the glass transition temperature parameters of the copolymer are controlled to fabricate a substrate with an acceptable value or range of values of the glass transition temperatures for the application.

In an embodiment, the first phase-separated polymer has a glass transition temperature greater than 50 degrees C., a range from about 50 degrees C. to about 100 degrees C., or about 80 degrees C. to about 100 degrees C. The block copolymer layer can comprise a di-block copolymer, a tri-block copolymer, or a tetra-block copolymer. Said block copolymer layer can comprise polystyrene-b-poly(methyl methacrylate). The first intermediate layer can include an anti-reflective coating and said first intermediate layer includes a silicon-containing anti-reflective coating. The substrate can further include a second intermediate layer underlying said first intermediate layer wherein said second intermediate layer can include an organic planarization layer. The first phase-separated polymer can include polystyrene and other polymers.

In operation 920, a first plasma etching process is performed using plasma formed of a first process composition to selectively remove said second phase-separated polymer while leaving behind said first pattern of said first phase-separated polymer on said surface of said substrate. In operation 930, a second plasma etching process is performed to transfer said first pattern at least partially into said first intermediate layer using plasma formed of a second process composition containing a halogen-containing gas. In an embodiment, the first plasma etching process is performed at a substrate temperature less than or equal to about 20 degrees C. In another embodiment, said halogen-containing gas includes $SF_6$. In still another embodiment, said second process composition further contains a $C_xF_yH_z$-containing gas, a $C_xF_y$-containing gas, or a second process composition further containing $C_4F_8$, or $SF_6$, or $C_4F_8$ and an optional noble gas. In yet still another embodiment, said performing said second plasma etching process comprises forming plasma from a process composition containing an oxygen-containing gas and a noble gas. In a further embodiment, said performing said second plasma etching process comprises forming plasma from a process composition containing $O_2$ and Ar. The process of performing the second plasma etching process will be described in detail in the discussion related to FIG. 12.

Figure 10:
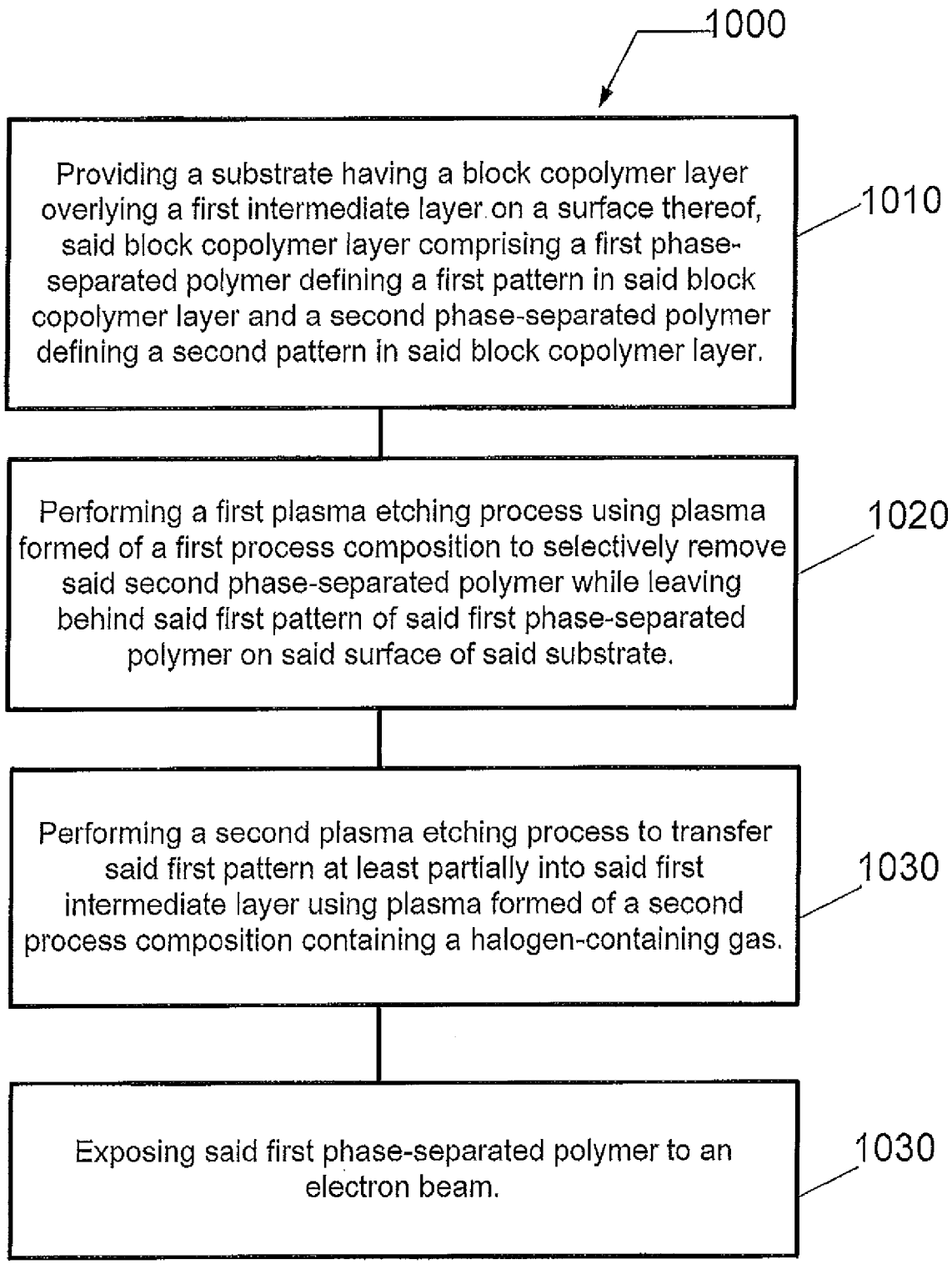
FIG. 10 is another exemplary flow chart illustrating further exemplary method operations for reducing DSA pattern defectivity of the block copolymer layer using direct current superpositioning.

FIG. 10 is another exemplary flow chart 1000 illustrating further exemplary method operations for reducing DSA pattern defectivity of the block copolymer layer using direct current superpositioning. Operations for the method of providing a substrate 1010, performing a first plasma etching process 1020, and performing a first plasma etching process 1020 of FIG. 10 are similar to corresponding operations of FIG. 9 method of providing a substrate 910, performing a first plasma etching process 920, and performing a first plasma etching process 920 of FIG. 9. In operations 1040, said first phase-separated polymer is exposed to an electron beam. The electron beam can be a ballistic electron beam generated by the DC power supply in the presence of plasma generated in previous sequences of the first or second plasma etching process. The exposure to said electron beam can be performed during said performing said first plasma etching process, or performed following said first plasma etching process and preceding said second plasma etching process, or performed during said second plasma etching process. As mentioned above, performing said second plasma etching process includes forming plasma between a lower electrode, upon which said substrate is placed, and an upper electrode, disposed opposite said lower electrode, and coupling a negative DC voltage to said upper electrode.

The inventors found that by using the operations of the above methods and process sequences described below, the directed self assembly defectivity of the substrate was controlled and were within the tolerances sought: For example, a line width roughness (LWR) of the first pattern following the first plasma etching process that is less than 2.60 nm was achieved, a line edge roughness (LERL) on a first edge (e.g., a left edge) of the first pattern that is less than 3.00 nm was achieved, and a line edge roughness (LERR) on a second edge (e.g., a right edge) of the first pattern that is less than 3.10 nm was achieved.

Figure 11:
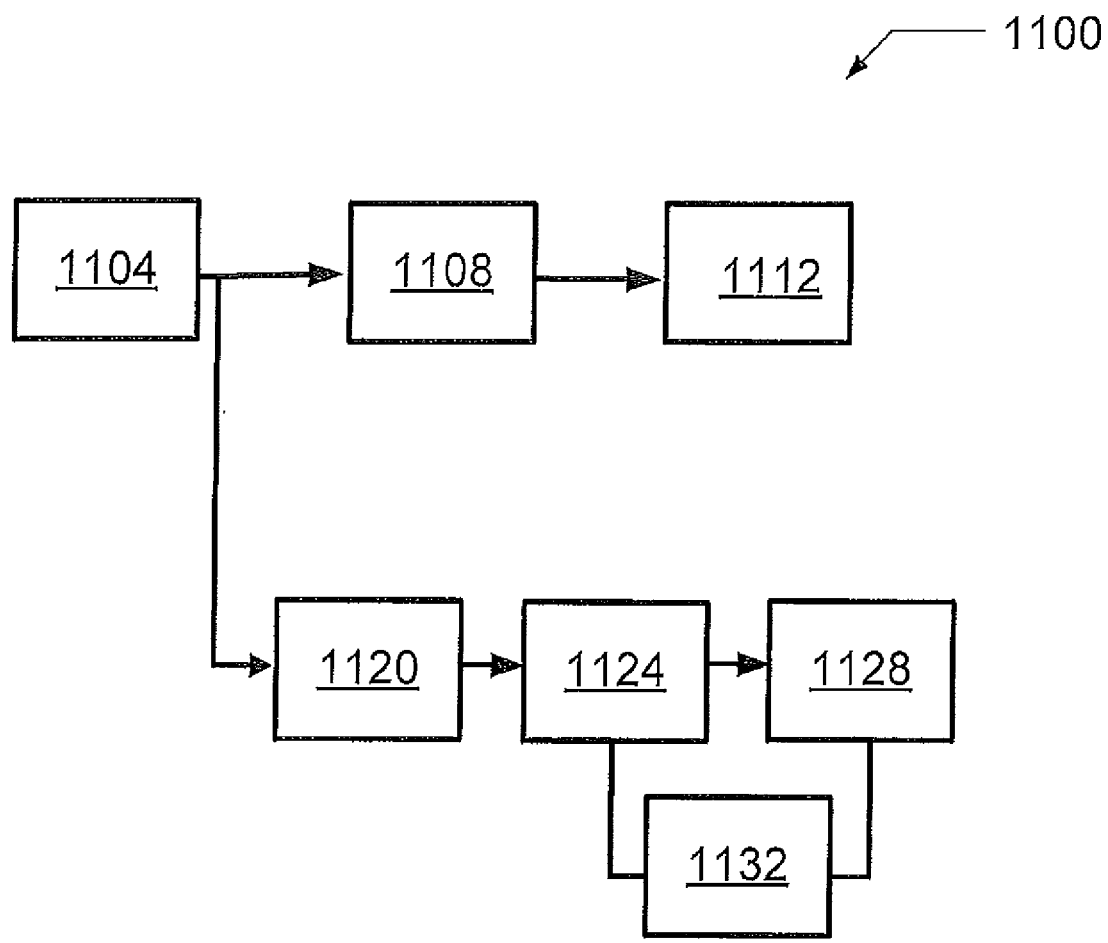
FIG. 11 is an exemplary architectural diagram of the fabrication processes involved in manufacturing sequences in embodiments for reducing pattern defectivity including direct current superpositioning.

FIG. 11 is an exemplary architectural diagram 1100 of the fabrication processes involved in manufacturing sequences for reducing pattern defectivity including direct current superpositioning. The first prong of process sequences includes the process of providing the substrate having a block copolymer layer can be performed in two distinct process sequences, namely, a first process sequence 1104 where the substrate is coated with a block copolymer and a second process sequence 1108 where the substrate is annealed, as discussed in connection with operations 310 of FIG. 3. A third process sequence 1112 includes performing an etching process to selectively remove the second phase-separated polymer while leaving behind the first pattern of the first phase-separated polymer on the surface of the substrate, the etching process being performed at a selected range of low temperatures using, for example, the substrate holder described in relation to FIG. 5. Process sequences 1104, 1108, and 1112 are similar to the process sequences described in relation to FIG. 6.

The second prong of process sequences includes providing a substrate having a block copolymer layer overlying an intermediate layer on a surface thereof, said block copolymer layer comprising a first phase-separated polymer defining a first pattern in said block copolymer layer and a second phase-separated polymer defining a second pattern in said block copolymer layer 1120, performing a first plasma etching process using plasma formed of a first process composition to selectively remove said second phase-separated polymer while leaving behind said first pattern of said first phase-separated polymer on said surface of said substrate 1124, performing a second plasma etching process to transfer said first pattern at least partially into said intermediate layer using plasma formed of a second process composition containing a halogen-containing gas 1128, and exposing said first phase-separated polymer to an electron beam 1132. As noted above, exposure to said electron beam 1132 can be performed during said performing said first plasma etching process, or performed following said first plasma etching process and preceding said second plasma etching process, or performed during said second plasma etching process.

Figure 12:
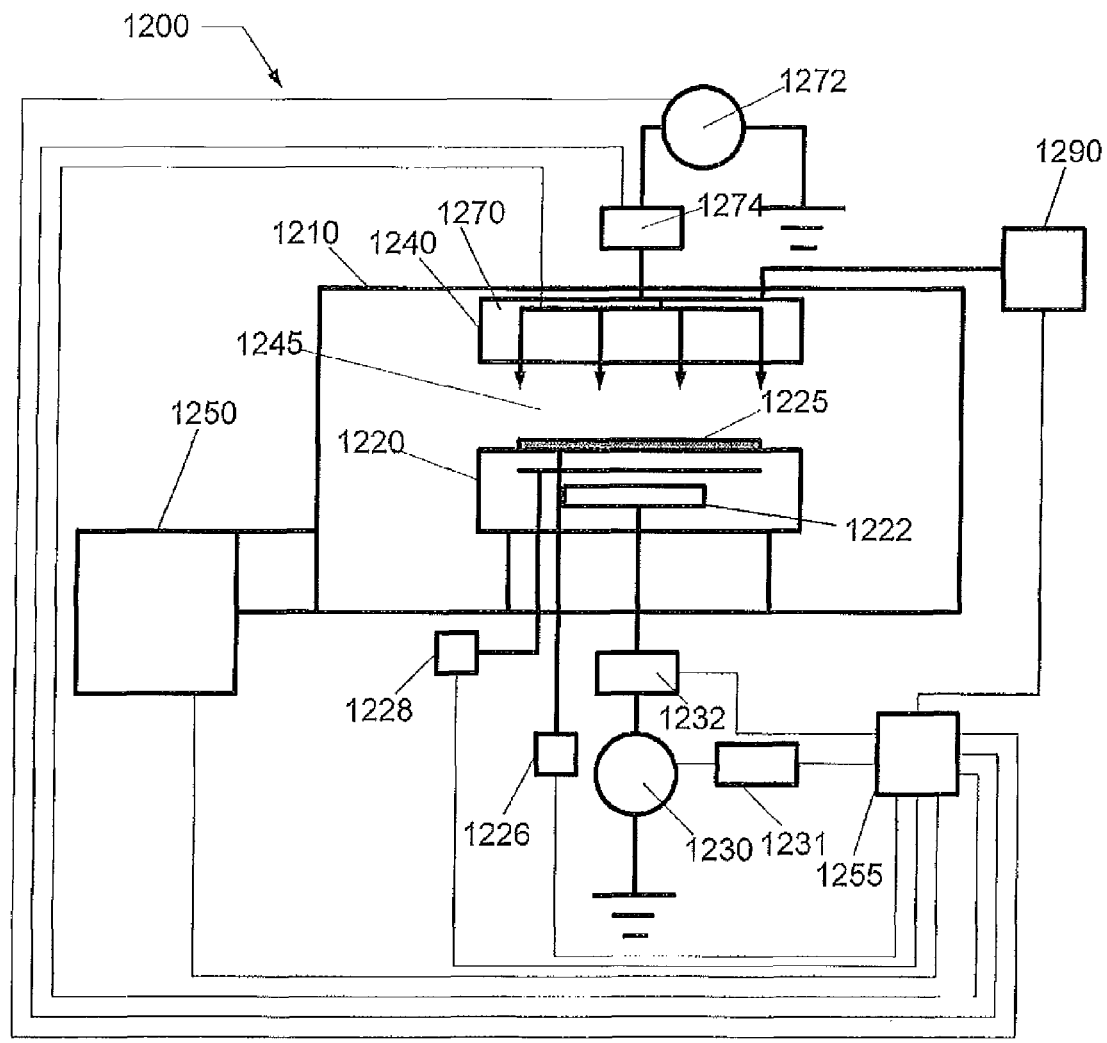
FIG. 12 is another exemplary simplified schematic of a control system used in process sequences to reduce defectivity of the block copolymer layer and controlling one or more operating parameters in one or more process sequences in an embodiment of the present invention.

FIG. 12 is another exemplary simplified schematic of a control system used in process sequences to reduce defectivity of the block copolymer layer and controlling one or more operating parameters in one or more process sequences using direct current positioning. In the embodiment shown in FIG. 12, plasma processing system 1200 can be similar to the embodiment described in FIG. 7, and can further comprise a direct current (DC) power supply 1290 coupled to the upper electrode 1270 opposing substrate 1225. The upper electrode 1270 may comprise an electrode plate. The electrode plate may comprise a silicon-containing electrode plate. Moreover, the electrode plate may comprise a doped silicon electrode plate. The DC power supply 1290 can include a variable DC power supply. Additionally, the DC power supply 1290 can include a bipolar DC power supply. The DC power supply 1290 can further include a system configured to perform at least one of monitoring, adjusting, or controlling the polarity, current, voltage, or on/off state of the DC power supply 1290. Once plasma is formed, the DC power supply 1290 facilitates the formation of a ballistic electron beam. An electrical filter (not shown) may be utilized to de-couple RF power from the DC power supply 1290.

For example, the DC voltage applied to upper electrode 1270 by DC power supply 1290 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 1300 V. Additionally, it is desirable that the DC voltage has a negative polarity. Furthermore, it is desirable that the DC voltage is a negative voltage having an absolute value greater than the self-bias voltage generated on a surface of the upper electrode 1270. The surface of the upper electrode 1270 facing the substrate holder 1220 may be comprised of a silicon-containing material.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. Additionally, based on the intrinsic etch selectivity provided by the choice of the appropriate polymer blocks, it will be appreciated that one of the domains may be selectively removed in a single step using a single etch chemistry or may be removed using multiple etches with different etch chemistries. The invention in its broader aspects is therefore not limited to the specific details, representative apparatus and method, and illustrative examples shown and described. Accordingly, departures may be made from such details without departing from the scope of the general inventive concept.

We claim:

1. A method for preparing a patterned directed self-assembly (DSA) layer, comprising:

providing a substrate having a block copolymer layer overlying a first intermediate layer on a surface thereof, said block copolymer layer comprising a first phase-separated polymer defining a first pattern in said block copolymer layer and a second phase-separated polymer defining a second pattern in said block copolymer layer;

performing a first plasma etching process using plasma formed of a first process composition to selectively remove said second phase-separated polymer while leaving behind said first pattern of said first phase-separated polymer on said surface of said substrate, wherein said performing said first plasma etching process includes forming plasma between a lower electrode, upon which said substrate is placed, and an upper electrode, disposed opposite said lower electrode, and coupling a negative DC voltage to said upper electrode; and exposing said first phase-separated polymer to an electron beam.

2. A method for preparing a patterned directed self-assembly (DSA) layer, comprising:

providing a substrate having a block copolymer layer overlying a first intermediate layer on a surface thereof, said block copolymer layer comprising a first phase-separated polymer defining a first pattern in said block copolymer layer and a second phase-separated polymer defining a second pattern in said block copolymer layer;

performing a first plasma etching process using plasma formed of a first process composition to selectively remove said second phase-separated polymer while leaving behind said first pattern of said first phase-separated polymer on said surface of said substrate; and exposing said first phase-separated polymer to an electron beam, wherein said exposing includes forming plasma between a lower electrode, upon which said substrate is placed, and an upper electrode, disposed opposite said lower electrode, and coupling a negative DC voltage to said upper electrode.

3. The method of claim 1, further comprising:

performing a second plasma etching process to transfer said first pattern at least partially into said first intermediate layer using plasma formed of a second process composition.

4. The method of claim 3, wherein:

said exposure to said electron beam is performed during said performing said first plasma etching process; or said exposure to said electron beam is performed following said first plasma etching process and preceding said second plasma etching process; or said exposure to said electron beam is performed during said second plasma etching process.

5. The method of claim 3, wherein said performing said second plasma etching process includes forming plasma between a lower electrode, upon which said substrate is placed, and an upper electrode, disposed opposite said lower electrode, and coupling a negative DC voltage to said upper electrode.

6. The method of claim 1, wherein said first plasma etching process is performed at a substrate temperature less than or equal to about 20 degrees C.

7. The method of claim 3, wherein said second process composition comprises a halogen-containing gas that includes $SF_6$.

8. The method of claim 7, wherein said second process composition further contains a $C_xF_yH_z$-containing gas, and wherein x and y are greater than zero and z is greater than or equal to zero.

9. The method of claim 7, wherein said second process composition further contains $C_4F_8$.

10. The method of claim 7, wherein said second process composition consists of $SF_6$, $C_4F_8$, and an optional noble gas.

11. The method of claim 1, wherein said block copolymer layer comprises a di-block copolymer, a tri-block copolymer, or a tetra-block copolymer.

12. The method of claim 1 wherein a line width roughness (LWR) of said first pattern following said first plasma etching process is less than 2.60 nm, a line edge roughness (LERL) on a first edge of said first pattern is less than 3.00 nm, and a line edge roughness (LERR) on a second edge of said first pattern is less than 3.10 nm.

13. The method of claim 1, wherein said first intermediate layer includes a silicon-containing anti-reflective coating.

14. A method for preparing a patterned directed self-assembly (DSA) layer, comprising:

providing a substrate having a block copolymer layer overlying an intermediate layer on a surface thereof, said block copolymer layer comprising a first phase-separated polymer defining a first pattern in said block copolymer layer and a second phase-separated polymer defining a second pattern in said block copolymer layer;

performing a first plasma etching process using plasma formed of a first process composition to selectively remove said second phase-separated polymer while leaving behind said first pattern of said first phase-separated polymer on said surface of said substrate; and performing a second plasma etching process to transfer said first pattern at least partially into said intermediate layer using plasma formed of a second process composition containing a halogen-containing gas, wherein said performing said first plasma etching process or performing said second plasma etching process, or both includes forming plasma between a lower electrode, upon which said substrate is placed, and an upper electrode, disposed opposite said lower electrode, and coupling a negative DC voltage to said upper electrode.

15. The method of claim 14, wherein said second process composition consists of $SF_6$, $C_4F_8$, and an optional noble gas.

16. The method of claim 2, wherein said exposing is performed in the same processing system as said performing said first plasma etching process.

17. The method of claim 2, wherein said exposing is performed during said performing said first plasma etching process.

18. The method of claim 2, wherein said exposing is performed after said performing said first plasma etching process.

19. The method of claim 18, wherein said exposing is performed in a different processing system as said performing said first plasma etching process.

* * * * *